(12) United States Patent
Tsurume et al.

(10) Patent No.: US 8,101,990 B2
(45) Date of Patent: Jan. 24, 2012

(54) SEMICONDUCTOR DEVICE

(75) Inventors: Takuya Tsurume, Kanagawa (JP);
Nozomi Horikoshi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 559 days.

(21) Appl. No.: 11/913,578

(22) PCT Filed: May 25, 2006

(86) PCT No.: PCT/JP2006/310945
§ 371 (c)(1),
(2), (4) Date: Nov. 5, 2007

(87) PCT Pub. No.: WO2006/129741
PCT Pub. Date: Dec. 7, 2006

(65) Prior Publication Data
US 2009/0090940 A1    Apr. 9, 2009

(30) Foreign Application Priority Data
May 31, 2005    (JP) .................................. 2005-159633

(51) Int. Cl.
*H01L 29/792* (2006.01)
(52) U.S. Cl. .......... 257/324; 257/E23.167; 257/E23.194
(58) Field of Classification Search .................. 257/324, 257/E23.167, E23.194
See application file for complete search history.

(56) References Cited

U.S. PATENT DOCUMENTS

| | | | |
|---|---|---|---|
| 5,757,456 A | 5/1998 | Yamazaki et al. | |
| 6,118,502 A | 9/2000 | Yamazaki et al. | |
| 6,489,662 B1 | 12/2002 | Takasu | |
| 6,781,152 B2 * | 8/2004 | Yamazaki | 257/59 |
| 6,828,727 B2 | 12/2004 | Yamazaki | |
| 7,045,438 B2 | 5/2006 | Yamazaki et al. | |
| 7,050,138 B1 | 5/2006 | Yamazaki et al. | |
| 7,119,364 B2 | 10/2006 | Yamazaki | |
| 2005/0070038 A1 | 3/2005 | Yamazaki et al. | |

(Continued)

FOREIGN PATENT DOCUMENTS

EP    1 122 794 A2    8/2001

(Continued)

OTHER PUBLICATIONS

International Search Report for PCT/JP2006/310945 Dated Aug. 22, 2006.

(Continued)

*Primary Examiner* — Evan Pert
*Assistant Examiner* — Hajar Kolahdouzan
(74) *Attorney, Agent, or Firm* — Nixon Peabody LLP; Jeffrey L. Costellia

(57) ABSTRACT

A semiconductor device is provided, which includes a first insulating layer over a first substrate, a transistor over the first insulating layer, a second insulating layer over the transistor, a first conductive layer connected to a source region or a drain region of the transistor through an opening provided in the second insulating layer, a third insulating layer over the first conductive layer, and a second substrate over the third insulating layer. The transistor comprises a semiconductor layer, a second conductive layer, and a fourth insulating layer provided between the semiconductor layer and the second conductive layer. One or plural layers selected from the first insulating layer, the second insulating layer, the third insulating layer, and the fourth insulating layer have a step portion which is provided so as not to overlap with the transistor.

18 Claims, 13 Drawing Sheets

U.S. PATENT DOCUMENTS

| | | |
|---|---|---|
| 2006/0063309 A1 | 3/2006 | Sugiyama et al. |
| 2006/0071953 A1 | 4/2006 | Yasue et al. |
| 2006/0097250 A1 | 5/2006 | Koyama et al. |
| 2006/0202206 A1 | 9/2006 | Koyama et al. |
| 2007/0082430 A1 | 4/2007 | Yamazaki |

FOREIGN PATENT DOCUMENTS

| | | |
|---|---|---|
| JP | 03-098082 | 4/1991 |
| JP | 04-178633 | 6/1992 |
| JP | 06-021217 | 1/1994 |
| JP | 06-021218 | 1/1994 |
| JP | 08-250745 | 9/1996 |
| JP | 09-260311 | 10/1997 |
| JP | 11-024106 | 1/1999 |
| JP | 2000-323655 | 11/2000 |
| JP | 2001-290439 | 10/2001 |
| JP | 3406727 | 5/2003 |

OTHER PUBLICATIONS

Written Opinion of the International Searching Authority for PCT/JP2006/310945 Dated Aug. 22, 2006.

* cited by examiner

90

90

90

90

122
121
90

516  509  517

510  516  520  509     517  511

514  512     513  515

SEMICONDUCTOR DEVICE

TECHNICAL FIELD

The present invention relates to a semiconductor device. The semiconductor device includes a transistor.

BACKGROUND ART

In recent years, a semiconductor device including a transistor has been developed. In such semiconductor devices, there is technology in which a release layer is formed over a glass substrate, a transistor is formed over the release layer, and subsequently the release layer is removed by using etchant such as halogen fluoride (Reference 1: Japanese Patent No. 3406727, for example).

DISCLOSURE OF INVENTION

When a transistor is separated from a substrate by using the technology as described in Reference 1 and is sealed with a substrate having flexibility (a film, for example), a semiconductor device having flexibility can be provided. In addition, a semiconductor device having flexibility can be provided by grinding and polishing a substrate provided with a transistor, as different from the above technology.

In such a semiconductor device having flexibility, when force is applied from outside or it is bent, a crack may be generated in the transistor included in the semiconductor device. Further, the crack may reach the transistor to damage or break the transistor.

A crack 80 tends to progress along a step region 81 (see FIGS. 8A, 8B, 8C, and 8D). Generation of a step portion is broadly divided into two factors. One factor is that an opening 86 is selectively provided in a first layer 83 in the case where the first layer 83 and a second layer 84 are stacked over a substrate 82 having an insulating surface (see FIG. 8C). Further, a depression is formed in the second layer 84 because the opening 86 is provided in the first layer 83. The other factor is the first layer 83 is selectively provided between the substrate 82 and the second layer 84 (see FIG. 8D).

In addition, the crack 80 tends to progress through a corner portion 87 of a layer 85 when a shape of top surface of the layer 85 is polygonal (see FIGS. 8E and 8F). In particular, the crack 80 is more likely to progress through the corner portion 87 when the corner portion 87 is an acute angle of equal to or less than 90 degrees.

It is an object of the present invention to provide a semiconductor device which can prevent damage and break of a transistor by controlling a region to which a crack progresses. In addition, it is an object of the present invention to provide a semiconductor device which uses a tendency for the crack to progress through a step region or a tendency for the crack to progress through a corner portion of a polygonal layer.

A semiconductor device of the present invention includes a first insulating layer provided over a first substrate, a transistor provided over the first insulating layer, a second insulating layer covering the transistor, a conductive layer connected to a source region or a drain region of the transistor through an opening provided in the second insulating layer, a third insulating layer covering the conductive layer, and a second substrate provided over the third insulating layer. The transistor includes a semiconductor layer, a fourth insulating layer, and a second conductive layer. The fourth insulating layer is provided between the semiconductor layer and the second conductive layer.

In the above described structure of the semiconductor device of the present invention, one or plural layers selected from the first insulating layer, the second insulating layer, the third insulating layer, and the fourth insulating layer have a step portion in a region which does not overlap with the transistor. The step portion is generated by providing each insulating layer with an opening.

In addition, a third conductive layer is provided over a same layer as one or both of the first conductive layer and the second conductive layer in the region which does not overlap with the transistor. Further, a second semiconductor layer is provided over the same layer as a first semiconductor layer in the region which does not overlap with the transistor.

A semiconductor device of the present invention provides a region of the step portion by providing the opening, the third conductive layer, or the second semiconductor layer, and the region to which the crack progresses is allowed to exist in the region which does not overlap with the transistor (the region except the region which overlaps with the transistor). Therefore, occurrence of damage and break of the transistor is suppressed.

In other words, the step portion makes the crack progress to the region which does not overlap with the transistor. Further, the step portion is preferably a shape which prevents the crack from progressing to the region which overlaps with the transistor.

It is to be noted that the crack is generated when physical force is applied to the semiconductor device. A case that the physical force is applied is a case that force is applied from outside, for example, corresponds to a case that a substrate and a transistor are separated. Timing at which the physical force is applied is not particularly limited and, for example, corresponds to a process for manufacturing the semiconductor device, after completing the semiconductor device, or the like. It is to be noted that the crack is easy to be generated in particular in the process for separating the substrate and the transistor. Therefore, it is effective that the present invention is applied to a method of manufacturing the semiconductor device including the separating process.

In addition, the crack is generated in one or both of a plane direction which is a lateral direction and a cross-sectional direction which is a vertical direction.

In the above described structure of the semiconductor device of the present invention, one or both of the third conductive layer and the second semiconductor layer is/are polygonal. The crack tends to progress through a corner portion of the polygonal layer. In particular, the crack is more likely to progress through the corner portion when an interior angle of the polygonal layer is an acute angle of equal to or less than 90 degrees. Therefore, a region to which the crack progresses can be more certainly controlled by making the third conductive layer polygonal and/or by making the second semiconductor layer polygonal.

In other words, the third conductive layer and the second semiconductor layer have shapes which make the crack progress to the region which does not overlap with the transistor. Further, the third conductive layer and the second semiconductor layer have the shapes which prevent the crack from progressing to the region which overlaps with the transistor.

In the above described structure of the semiconductor device of the present invention, a protective layer is provided between the first substrate and the first insulating layer. Further, a protective layer is provided between the third insulating layer and the second substrate.

Generation of the crack can be suppressed because the semiconductor device is difficult to be bent by the above described characteristics. In addition, even if the semiconductor device is bent by an action from outside, an impact on the transistor is reduced and the damage and break of the transistor can be suppressed. Further, invasion of harmful gas, water, and an impurity element are suppressed and the damage and break of the transistor can be suppressed.

In addition, the first substrate is a glass substrate or a silicon substrate and has a thickness of equal to or less than 100 μm, preferably equal to or less than 50 μm. Alternatively, the first substrate and the second substrate are substrates having flexibility. The substrate having flexibility corresponds to a film made of polyethylene or the like, for example. The above features make it possible to provide a semiconductor device having flexibility.

In the above description, the step portion is generated by providing each insulating layer with the opening; however, the present invention is not limited to this structure. The step portion may be generated by providing an opening in one or both of the semiconductor layer and the conductive layer. In other words, the step portion may be generated by providing an opening in one or plural of layers selected from the insulating layer, the semiconductor layer, and the conductive layer.

According to the present invention, a region to which a crack progresses is made to a region which does not overlap with transistors (a region except a region which overlaps with the transistor) by providing a region of a step portion or a polygonal layer; therefore, occurrence of damage and break of the transistor can be suppressed.

BEST MODE FOR CARRYING OUT THE INVENTION

Figure 1A:
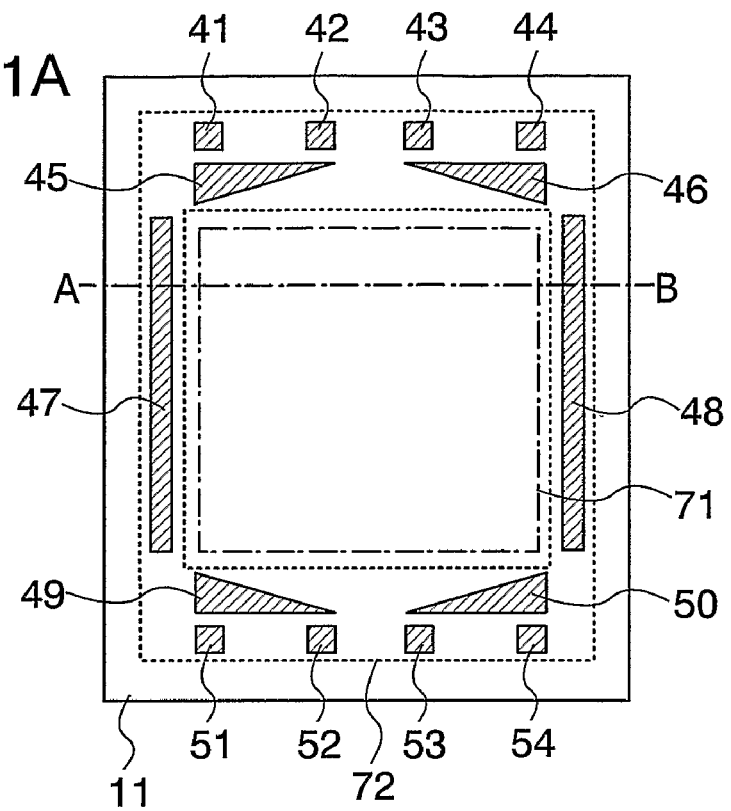
FIGS. 1A and 1B show a semiconductor device according to the present invention.

Embodiment modes and embodiments of the present invention will be described in detail with reference to the drawings. However, it is easily understood by those skilled in the art that the present invention is not limited to the following descriptions and various changes may be made in modes and details without departing from the spirit and the scope of the invention. Therefore, the present invention should not be limited to descriptions of Embodiment Modes and Embodiments below. The same reference numerals are commonly given to the same components in the structures of the invention, which will be described below.

Embodiment Mode 1

A semiconductor device according to the present invention will be described with reference to FIGS. 1A, 1B, 2A, and 2B.

A top surface structure of the semiconductor device of the present invention will be described with reference to FIGS. 1A and 1B. A first region 71 and a second region 72 are provided over a substrate 11 (see FIG. 1A). The first region 71 is a region to be provided with an element such as a transistor, a resistor element (a resistor), or a capacitor element (a capacitor). The second region 72 is a region to be provided with a step portion. The second region 72 is provided, for example, at a boundary between circuits constructed by a plurality of transistors, at a periphery of a circuit, at a boundary between transistors, at a periphery of a transistor, or the like. In other words, the second region 72 is provided between circuits in the first region 71, at a periphery of the first region 71, between transistors in the first region 71, at a periphery of the first region 71, or the like.

Figure 1B:
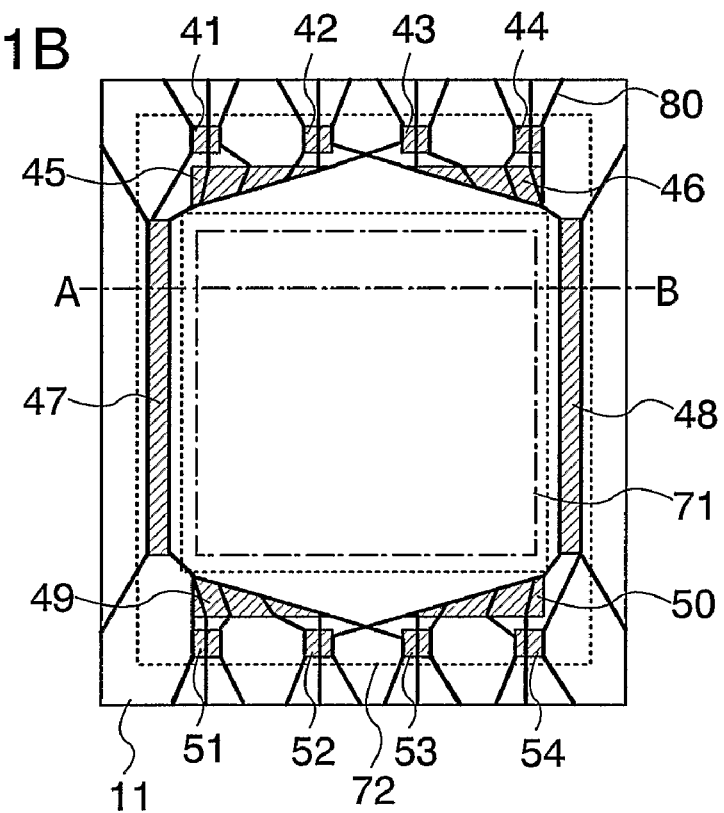

In a structure shown in FIGS. 1A and 1B, the first region 71 is provided with one or more circuits including a plurality of transistors, and the second region 72 is provided at the periphery of the first region 71. It is to be noted that regions 41 to 54 in the second region 72 are regions to be provided with a step portion. In addition, regions 45, 46, 49, and 50 are regions to be provided with a polygonal layer. The polygonal layer is a layer having a polygonal top surface. It is to be noted that the polygonal layer has preferably an interior angle of equal to or less than 90 degrees. This is because a crack is more likely to progress through a corner portion thereof when the interior angle equal to or less than 90 degrees; therefore, the crack progress can be more certainly controlled.

Figure 2A:
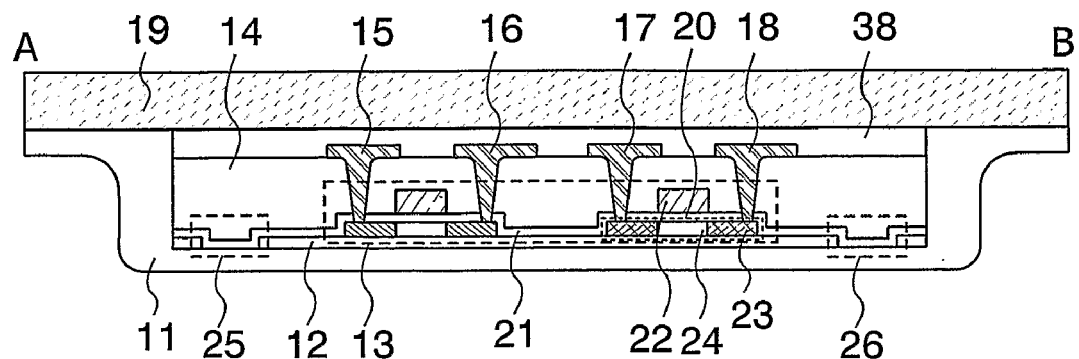
FIGS. 2A and 2B show a semiconductor device according to the present invention.

Next, a cross-sectional structure of a semiconductor device of the present invention will be described (see FIG. 2A). It is to be noted that FIG. 2A is a cross-sectional view taken along line A-B in FIG. 1A.

A semiconductor device of the present invention includes the substrate 11, an insulating layer 12 provided over the substrate 11, and a plurality of transistors 13 provided over the insulating layer 12. In addition, it includes an insulating layer 14 covering the plurality of transistors 13 and conductive layers 15 to 18 connected to source regions or drain regions of the plurality of transistors 13 through openings provided in the insulating layer 14. Further, it includes an insulating layer 38 covering the conductive layers 15 to 18 and a substrate 19 provided over the insulating layer 38.

Each of the plurality of transistors 13 has a semiconductor layer 20, a gate insulating layer 21, and a conductive layer 22. The conductive layer 22 is a gate electrode and is provided so as to overlap with the semiconductor layer 20. The semiconductor layer 20 has an impurity region 23 corresponding to a source region or a drain region and a channel forming region 24. It is to be noted that each of the plurality of transistors 13 may be either a top gate type in which the gate insulating layer 21 is provided over the semiconductor layer 20 and the conductive layer 22 is provided over the gate insulating layer 21 or a bottom gate type in which the gate insulating layer 21 is provided over the conductive layer 22 and the semiconductor layer 20 is provided over the gate insulating layer 21.

In a semiconductor device of the present invention, a step portion is provided over or in one or plural layers selected from the plurality of insulating layers (the insulating layers 12, 14, 21, and 38) in a region where the plurality of transistors 13 are not provided, that is, a region which does not overlap with the plurality of transistors 13. In other words, an opening is provided in one or plural layers selected from the plurality of insulating layers (the insulating layers 12, 14, 21, and 38). In many cases, a step portion generated by providing the opening is a depression portion.

In a structure shown in FIG. 2A, openings 25 and 26 selectively are provided in the insulating layer 12. As described above, the step portions are provided by selectively providing the openings 25 and 26. According to the present invention, a region which a crack progresses is made to a region which does not overlap with the plurality of transistors 13 (a region except the region which overlaps with the transistors) by providing the step portion; therefore, occurrence of damage and break of the plurality of transistors 13 can be suppressed.

The openings 25 and 26 are formed by using photolithography, laser beam irradiation, or the like. In addition, one or plural layers selected from the plurality of insulating layers (the insulating layers 12, 14, 21, and 38) may be selectively formed in advance by using a screen printing method, a droplet discharge method (for example, ink-jet printing), or the like.

Note that, according to the above structure, four insulating layers (the insulating layers 12, 14, 21, and 38) are provided; however, the present invention is not limited to this structure. The openings may be selectively provided in one or plural layers selected from the plurality of insulating layers included in the semiconductor device. In addition, in the above described structure, each of the insulating layers 12, 14, 21, and 38 is a single layer; however, they each may be a stacked structure.

In addition, the plurality of insulating layers included in the semiconductor device (the insulating layers 12, 14, 21, and 38 in the above described structure) are formed by using an oxide of silicon, a nitride of silicon, polyimide, acrylic, siloxane, or the like. Siloxane, for example, includes a skeleton formed from a bond of silicon and oxygen, and an organic group containing at least hydrogen (for example, an alkyl group or an aromatic hydrocarbon) or a fluoro group is used for a substituent, or an organic group containing at least hydrogen and a fluoro group are used for substituents.

Figure 2B:
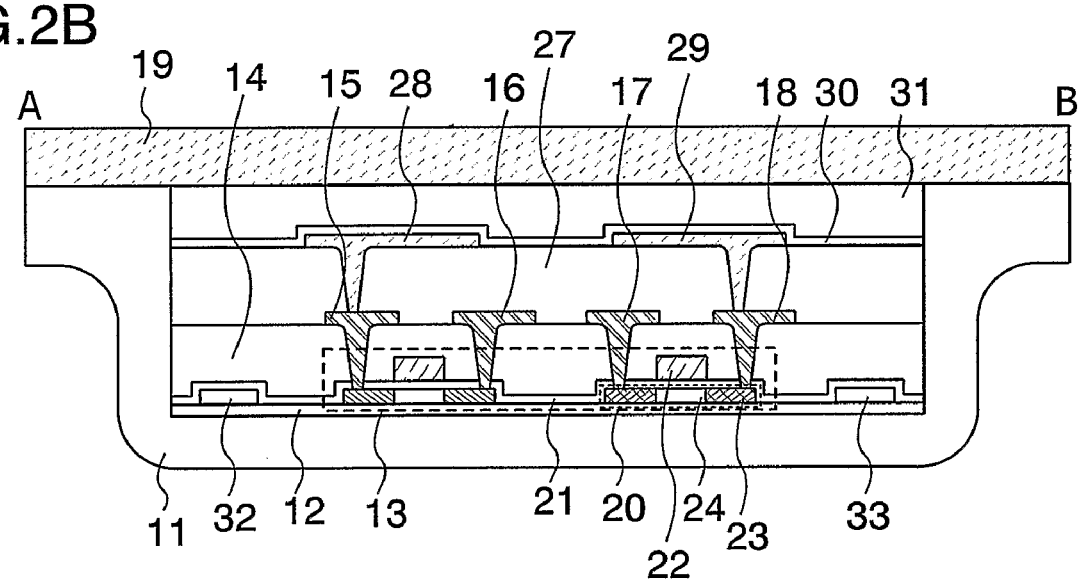

Next, a cross-sectional structure of a semiconductor device of the present invention, which is different from the above (see FIG. 2B). It is to be noted that FIG. 2B is a cross-sectional view taken along line A-B in FIG. 1A.

A semiconductor device according to the present invention includes the substrate 11, an insulating layer 12 provided over the substrate 11, and a plurality of transistors 13 provided over the insulating layer 12. In addition, it includes an insulating layer 14 covering the plurality of transistors 13 and conductive layers 15 to 18 connected to source regions or drain regions of the plurality of transistors 13 through openings provided in the insulating layer 14. Further, it includes an insulating layer 27 covering the conductive layers 15 to 18 and conductive layers 28 and 29 connected to the conductive layers 15 and 18 respectively through openings provided in the insulating layer 27. Furthermore, it includes an insulating layer 30 covering the conductive layers 28 and 29 and an insulating layer 31 provided over the insulating layer 30. Moreover, it includes a substrate 19 covering the insulating layer 31. The conductive layers 28 and 29 each correspond to a conductive layer serving as an antenna. It is to be noted that the conductive layers serving as antennas may be formed over one layer or plural layers.

In a semiconductor device of the present invention, a new conductive layer is provided over a same layer as one or plural layers selected from the conductive layers 15 to 18, the conductive layers 28 and 29, and the conductive layer 22 in a region where the plurality of transistors 13 are not provided, that is, a region which does not overlap with the plurality of transistors 13. In addition, a new semiconductor layer is provided over the same layer as a semiconductor layer 20 in the region which does not overlap with the plurality of transistors 13. In many cases, a step portion generated by providing the new conductive layer or the new semiconductor layer is a projection portion.

In a structure shown in FIG. 2B, semiconductor layers 32 and 33 are provided over the same layer as the semiconductor layer 20. As described above, the step portion is provided by providing the conductive layer or the semiconductor layer in the region where the plurality of transistors 13 are not provided. According to the present invention, a region which a crack progresses is made to a region which does not overlap with the plurality of transistors 13 (a region except the region which overlaps with the transistors) by providing the step portion; therefore, occurrence of damage and break of the plurality of transistors 13 can be suppressed.

Note that, according to the above structure, three conductive layers (the conductive layers 15 to 18, the conductive layers 28 and 29, and the conductive layer 22) and one semiconductor layer (the semiconductor layer 20) are provided. Further, according to the above structure, the new conductive layer or the new semiconductor layer is provided over the same layer as one or plural layers selected from these three conductive layers or the one semiconductor layer; however, the present invention is not limited to this structure. According to the present invention, a new conductive layer may be selectively provided over the same layer as one or plural layers selected from all conductive layers included in the semiconductor device. In addition, a new semiconductor layer may be selectively provided over the same layer as one or plural layers selected from all semiconductor layers included in the semiconductor device.

In addition, according to the above structure, the new conductive layer or the new semiconductor layer is provided over the same layer as one or plural layers selected from three conductive layers (the conductive layers 15 to 18, the conductive layers 28 and 29, and the conductive layer 22) and one semiconductor layer (the semiconductor layer 20); however, the present invention is not limited to this structure. A projection-shaped step portion may be provided by selectively providing a new insulating layer in a region which does not overlap with the plurality of transistors 13.

In the structure shown in FIG. 2A, the step portions are provided by providing the openings, and in the structure shown in FIG. 2B, the step portions are provided by selectively providing the conductive layers or the semiconductor layers. The present invention may combine these structures.

In the structure shown in the figures, only the plurality of transistors 13 are formed; however, the present invention is not limited to this structure. An element provided over the substrate 11 may be appropriately adjusted in accordance with use of the semiconductor device. For example, in the case of forming a semiconductor device having a function of transmitting and receiving an electromagnetic wave, a plurality of transistors may be formed over the substrate 11. Alternatively, a plurality of transistors and a conductive layer serving as an antenna may be formed over the substrate 11. In addition, in the case of forming a semiconductor device having a function of storing data, a plurality of transistors and a memory element (for example, such as a transistor or a memory transistor) may be formed over the substrate 11. Further, in the case of forming a semiconductor device having a function of controlling a circuit, generating a signal, or the like (for example, such as a CPU or a signal generation circuit), a transistor may be formed over the substrate 11. Furthermore, another element such as a resistor element or a capacitor element may be formed if necessary.

Next, in the above described structure of the semiconductor device of the present invention, a case that a crack 80 is generated by force applied from outside will be described (see FIG. 1B). The crack 80 progresses through regions 41 to 54 in which step portions are provided. In addition, the crack 80 progresses through corner portions of regions 45, 46, 49, and 50 in which polygonal layers are provided. Therefore, a region to which the crack progresses is made to a region which does not overlap with a transistor (a region except a region which overlaps with a transistor) by providing the regions of the step portions or the polygonal layers, therefore, occurrence of damage and break of the transistor can be suppressed. The embodiment mode of the present invention can be freely combined with other embodiment modes and other embodiments.

Embodiment Mode 2

Figure 3A:
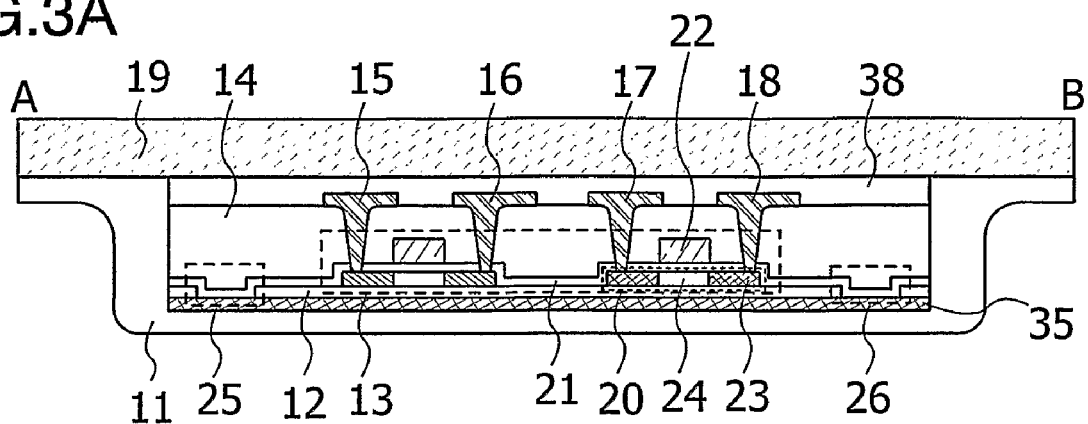
FIGS. 3A and 3B show a semiconductor device according to the present invention.
Figure 3B:
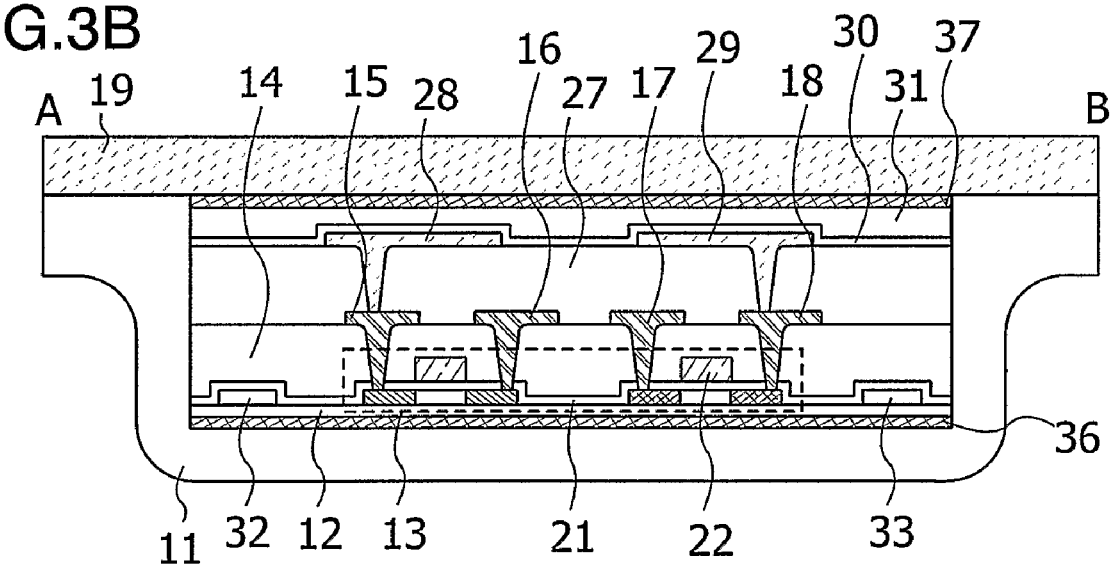

A semiconductor device of the present invention will be described with reference to FIGS. 3A and 3B. FIGS. 3A and 3B each are a cross-sectional view taken along line A-B in FIG. 1A.

A semiconductor device of the present invention includes the substrate 11, an insulating layer 12 provided over the substrate 11, and a plurality of transistors 13 provided on the insulating layer 12 (see FIG. 3A). In addition, it includes an insulating layer 14 covering the plurality of transistors 13 and conductive layers 15 to 18 connected to source regions or drain regions of the plurality of transistors 13 through openings provided in the insulating layer 14. Further, it includes an insulating layer 38 covering the conductive layers 15 to 18 and a substrate 19 provided over the insulating layer 38. The semiconductor device of this structure is provided with a protective layer 35 between the substrate 11 and the insulating layer 12.

A semiconductor device of the present invention includes the substrate 11, an insulating layer 12 provided over the substrate 11, and a plurality of transistors 13 provided on the insulating layer 12 (see FIG. 3B). In addition, it includes an insulating layer 14 covering the plurality of transistors 13 and conductive layers 15 to 18 connected to source regions or drain regions of the plurality of transistors 13 through openings provided in the insulating layer 14. Further, it includes an insulating layer 27 covering the conductive layers 15 to 18 and conductive layers 28 and 29 connected to the conductive layers 15 and 18 through openings provided in the insulating layer 27. Furthermore, it includes an insulating layer 30 covering the conductive layers 28 and 29 and an insulating layer 31 provided over the insulating layer 30. In addition, it includes a substrate 19 covering the insulating layer 31. The semiconductor device is provided with a protective layer 36 between the substrate 11 and the insulating layer 12 and a protective layer 37 between the insulating layer 31 and the substrate 19.

The protective layers 35 to 37 are each made of a conductive material or an insulating material, preferably a material having high hardness. The material having high hardness, for example, includes chromium (Cr), iridium (Ir), osmium (Os), silicon (Si), tungsten (W), cobalt (Co), iron (Fe), manganese (Mn), palladium (Pd), platinum (Pt), a thin film including carbon (for example, diamond like carbon film), and the like.

The semiconductor device is difficult to be bent by providing the protective layers 35 to 37; therefore, generation of a crack can be suppressed. In addition, even if the semiconductor device is bent by an action from outside, an impact on the transistors 13 is reduced and damage and break of the transistors 13 can be suppressed. Further, invasion of harmful gas, water, and an impurity element are suppressed and the damage and break of the transistors can be suppressed.

It is to be noted that one protective layer 35 is provided in the structure shown in FIG. 3A and two protective layers 36 and 37 are provided in the structure shown in FIG. 3B; however, the present invention is not limited to these structures. Further, a plurality of protective layers may be stacked in order to further enhance strength. Moreover, a protective layer may be selectively provided. For example, the protective layer may be provided only in a region in which the plurality of transistors 13 are provided.

In addition, when the protective layers are made of conductive materials, a storage capacitance is formed between the protective layer and the plurality of transistors 13, and between the protective layers and the conductive layers 15 to 18. Thus, a low dielectric constant material (for example, siloxane, organic resin, and the like) may be used as an insulating layer provided between the protective layer and the plurality of transistors 13 and an insulating layer provided between the protective layers and the conductive layers 15 to 18 in order to reduce a value of the storage capacitance. Further, the insulating layer provided between the protective layer and the plurality of transistors 13 and insulating layer provided between the protective layers and the conductive layers 15 to 18 each may be formed to have a thick thickness. Therefore, the value of the storage capacitance which is formed between the protective layer and the plurality of transistors 13, and between the protective layers and the conductive layers 15 to 18 can be reduced. The embodiment mode of the present invention can be freely combined with other embodiment modes and other embodiments.

Embodiment Mode 3

A method of manufacturing a semiconductor device of the present invention will be described with reference to FIGS. 4A, 4B, and 5.

Figure 4A:
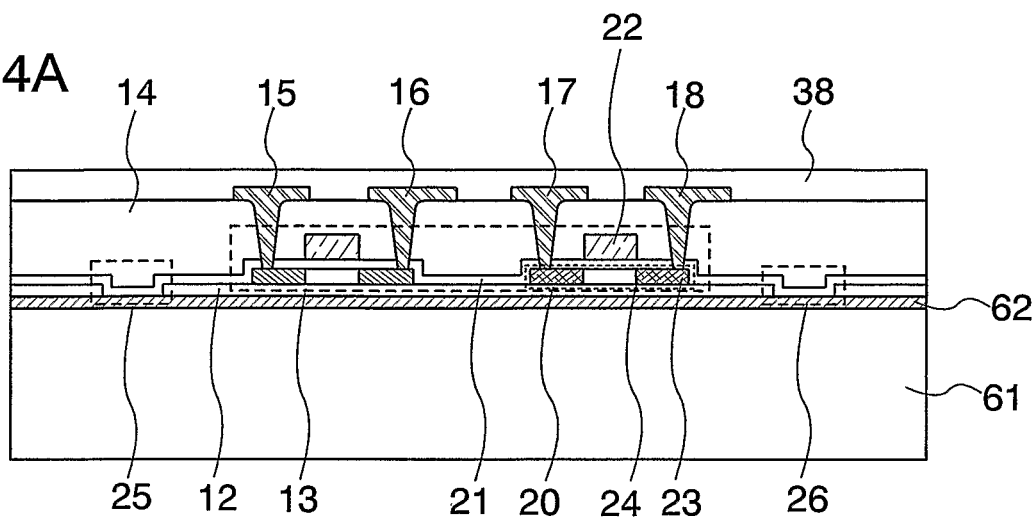
FIGS. 4A and 4B show a semiconductor device according to the present invention.
Figure 4B:
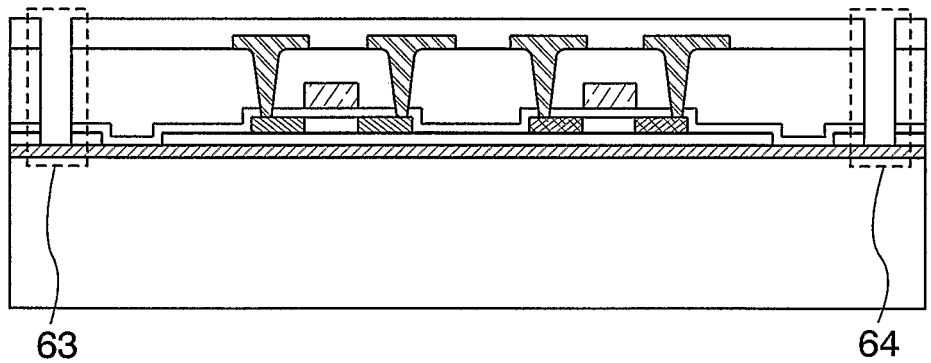
Figure 5:
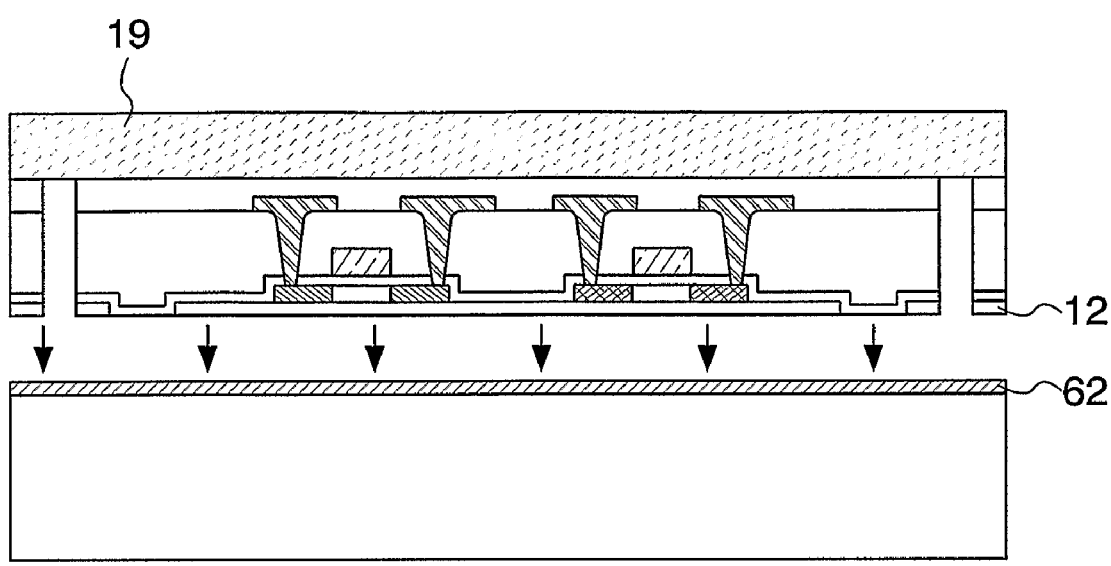
FIG. 5 shows a semiconductor device according to the present invention.

First, a release layer 62 is formed over one surface of a substrate 61 having an insulating surface (see FIG. 4A). The substrate 61 corresponds to a glass substrate, a silicon substrate, a quartz substrate, or the like. Preferably, a glass substrate or a plastic substrate may be used as the substrate 61, since it is easy to form the glass substrate or the plastic substrate having one side of 1 meter or more and also it is easy to form the glass substrate or the plastic substrate having a desired shape such as a square-shaped. Therefore, when such a glass substrate or plastic substrate having, for example, a square-shaped and one side of 1 meter or more is used, productivity can be largely improved. This is a great advantage compared with a case where a silicon substrate having a circular shape and up to around 30 centimeters in diameter is used. It is to be noted that a glass epoxy substrate may be used as the glass substrate.

The release layer 62 is formed of a layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), or the like, or an alloy material or a compound material containing the element as a main component by sputtering, plasma CVD, or the like. The release layer may have a single layer structure or a stacked structure. The crystal structure of a layer containing silicon may be any one of the amorphous, microcrystalline, and polycrystalline structure.

In the case where the release layer 62 has a single-layer structure, it is preferable to form a layer containing any of tungsten, molybdenum, a mixture of tungsten and molybdenum, an oxide of tungsten, an oxynitride of tungsten, a nitride oxide of tungsten, an oxide of molybdenum, an oxynitride of molybdenum, a nitride oxide of molybdenum, an oxide of a mixture of tungsten and molybdenum, an oxynitride of a mixture of tungsten and molybdenum, and a nitride oxide of a mixture of tungsten and molybdenum. It is to be noted that the mixture of tungsten and molybdenum is an alloy of tungsten and molybdenum, for example.

In the case where the release layer 62 has a stack structure, it is preferable that a layer containing tungsten, molybdenum, or a mixture of tungsten and molybdenum is formed as a first layer, and a layer containing an oxide of tungsten, an oxide of molybdenum, an oxide of a mixture of tungsten and molybdenum, an oxynitride of tungsten, an oxynitride of molybdenum, or an oxynitride of a mixture of tungsten and molybdenum is formed as a second layer.

In the case where the release layer 62 has a stack structure of tungsten and oxide of tungsten, a layer containing tungsten is formed as the release layer 62, and a layer containing oxide of silicon is formed thereover as the insulating layer 12, so that a layer containing oxide of tungsten is formed at the interface between the layer containing tungsten and the layer containing oxide of silicon. This also applies to the case of forming a layer containing nitride, oxynitride or nitride oxide of tungsten or the like. In such a case, after a layer containing tungsten is formed, a layer containing nitride of silicon, a silicon nitride layer containing oxygen, or a silicon oxide layer containing nitrogen may be formed thereover.

It is to be noted that although the release layer 62 is formed over the surface of the substrate 61 in this process, if necessary, it may be selectively patterned by photolithography after the release layer is formed over the surface of the substrate 61. In addition, the release layer 62 is formed to be in contact with the substrate 61; however, if necessary, a base insulating layer may be formed to be in contact with the substrate 61 and the release layer 62 may be formed to be in contact with the base insulating layer. The base insulating layer serves as a blocking film for preventing invasion of impurities from the substrate 61.

Subsequently, the base insulating layer 12 is formed to cover the release layer 62. The insulating layer 12 is formed from a layer containing an oxide of silicon or a nitride of silicon by sputtering, plasma CVD, or the like as a single layer or a laminated layer. An oxide material of silicon is a material containing silicon (Si) and oxygen (O), and corresponds to a silicon oxide, a silicon oxide containing nitrogen, or the like. A nitride material of silicon is a material containing silicon and nitrogen (N), and corresponds to a silicon nitride, a silicon nitride containing oxygen, or the like. Next, openings 25 and 26 are selectively formed in the insulating layer 12 by using photolithography.

Subsequently, an amorphous semiconductor layer is formed over the insulating layer 12. The amorphous semiconductor layer is formed by sputtering, LPCVD, plasma CVD, or the like. Subsequently, the amorphous semiconductor layer is crystallized by a laser crystallization method, a thermal crystallization method using an RTA (Rapid Thermal Anneal) or an annealing furnace, a thermal crystallization method using a metal element promoting crystallization, a method combining the thermal crystallization method using a metal element promoting crystallization and the laser crystallization method, or the like, thereby obtaining a crystalline semiconductor layer. Then, the obtained crystalline semiconductor layer is patterned into a desired shape to form a crystalline semiconductor layer 20.

Then, a gate insulating layer 21 is formed to cover the semiconductor layer 20. The gate insulating layer 21 is formed from a layer containing an oxide of silicon or a nitride of silicon by plasma CVD, sputtering, or the like as a single layer or a laminated layer.

Then, a conductive layer 22 is formed over the gate insulating layer 21. The conductive layer 22 is formed by plasma CVD, sputtering, or the like to have a thickness of 20 to 400 nm. The conductive layer is formed of an element selected from tantalum (Ta), tungsten (W), titanium (Ti), molybdenum (Mo), aluminum (Al), copper (Cu), chromium (Cr), or the like, or an alloy material or a compound material containing the element as a main component. Instead, the conductive layer 22 is formed of a semiconductor material typified by polycrystalline silicon which is doped with an impurity element such as phosphorus.

Then, a resist mask is formed by photolithography, and an impurity element that imparts N-type or P-type conductivity is added to the semiconductor layer 20 by ion doping or ion implantation, thereby forming an impurity region 23 and a channel forming region 24. The impurity element that imparts N-type conductivity may be an element belonging to group 15 of the periodic table, and for example, phosphorus (P) or arsenic (As) may be used. In addition, as the impurity element that imparts P-type conductivity, for example, boron (B) is used. Through the above described steps, a plurality of transistors 13 are completed.

Next, an insulating layer 14 is formed to cover the gate insulating layer 21 and the conductive layer 22. The insulating layer 14 is formed from a layer containing an inorganic material of silicon, an oxide of silicon, or a nitride of silicon, or a layer containing an organic material such as an organic resin by plasma CVD, sputtering, or the like as a single layer or a laminated layer.

Next, the insulating layer 14 is etched by photolithography, thereby forming openings to expose the impurity region 23. Then, conductive layers are formed to fill the openings, and patterned to form conductive layers 15 to 18 functioning as source wirings or drain wirings. The conductive layers 15 to 18 are formed from an element selected from titanium (Ti), aluminum (Al), neodymium (Nd), or the like, or an alloy material or a compound material containing the element as a main component by plasma CVD and sputtering, or the like as a single layer or a laminated layer.

Next, an insulating layer 38 is formed to cover the conductive layers 15 to 18. The insulating layer 38 is formed from an inorganic material or an organic material by SOG (spin on glass), droplet discharging, or the like as a single layer or a laminated layer.

Subsequently, the insulating layers 12, 21, 14, and 38 are etched by photolithography or irradiation of a laser beam to expose at least a part of the release layer 62, thereby forming openings 63 and 64 (see FIG. 4B). In this process, the substrate 61 may be cut as well as the insulating layers 12, 21, 14, and 38. Alternatively, the substrate 61 may be scratched and cut from the scratch thereof.

Subsequently, a surface of the insulating layer 38 is bonded to a substrate 19 and a stack including the plurality of transistors 13 is separated from the substrate 61 (see FIG. 5). In this case, the exposed release layer 62 is a trigger (an origin) for separation. This separation is performed inside the release layer 62 or at a boundary between the release layer 62 and the insulating layer 12.

The stack including the plurality of transistors 13 is separated from the substrate 61 by using the exposed release layer 62 as a trigger (as an origin) in the above manufacturing process; however, the present invention is not limited to this process. An etchant may be introduced into the openings 63 and 64, thereby removing the release layer 62. A gas or liquid containing halogen fluoride is used as the etchant. For example, chlorine trifluoride ($ClF_3$), nitrogen trifluoride ($NF_3$), bromine trifluoride ($BrF_3$), or hydrogen fluoride (HF) is used. In the case of using hydrogen fluoride as the etchant, a layer made of a silicon oxide is used as the release layer 62. The substrate 61 provided with the plurality of transistors 13 may be reused for cost-cutting.

Subsequently, a substrate 11 is provided over the surface of the insulating layer 12. Then, one or both of thermal treatment and pressure treatment is/are performed to seal the stack including the plurality of transistors 13 with the substrate 11 and the substrate 19 (see FIG. 1A).

Each of the substrates (it can be also referred to as a base, a film, or a tape) 11 and 19 is a substrate having flexibility. Each of the substrates 11 and 19 is made of a material such as polyethylene, polypropylene, polystyrene, AS resin, ABS resin (a resin in which acrylonitrile, butadiene, and styrene are polymerized), methacrylic resin (also referred to as acryl), polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, phenolic resin, urea resin, melamine resin, epoxy resin, diallyl phthalate resin, unsaturated polyester resin, polyimide, or polyurethane, or a fibrous material (paper, for example). Each of the substrates 11 and 19 may have a single layer structure or a stacked structure. Further, each surface of the substrates may be provided with an adhesive layer. The adhesive layer corresponds to a layer including an adhesive such as a thermosetting resin, an ultraviolet curable resin, a vinyl acetate resin based adhesive, a vinyl copolymer resin based adhesive, an epoxy resin based adhesive, a polyurethane resin based adhesive, a rubber based adhesive, or an acrylic resin based adhesive.

Each the surface of the substrates 11 and 19 may be coated with powders of silicon dioxide (silica). Because of the coating, water-resistant properties can be kept even under a high-temperature and high-humidity environment. Moreover, the surfaces may be coated with a conductive material such as an indium tin oxide. Since the coating material holds electrostatic, the thin film integrated circuit can be protected from the electrostatic. Furthermore, the surfaces may be coated with a material containing carbon as a main component (a diamond-like carbon, for example). The strength can be increased by the coating, and the damage of the thin film integrated circuit can be suppressed. In addition, the substrates 11 and 19 may be formed of a material which is made by mixing a base material (a resin, for example) with a material containing a silicon dioxide, a conductive material, or carbon as a main component.

The plurality of transistors 13 are sealed with the substrates 11 and 19 by melting the surface layers of each of the substrates 11 and 19 or the adhesive layers in the surfaces of each of the substrates 11 and 19 by means of thermal treatment. In addition, they are bonded by pressure treatment, if necessary.

If the substrates 11 and 19 have flexibility, they are thin, lightweight, and can be bent; therefore, a semiconductor device having a superior design can be provided. Therefore, since it is easy to process the semiconductor device into a flexible shape, it is easily fixed to various articles; therefore, it can be utilized in various fields.

It is to be noted that one or both of the substrates 11 and 19 may be provided with a conductive layer serving as an antenna. When the stack including the plurality of transistors 13 is sealed with the substrates 11 and 19, the conductive layers provided over the substrates 11 and 19 and the plurality of transistors 13 may be electrically connected. In this case, the stack including the plurality of transistors 13 is provided with an exposed conductive layer for connection. In the case of sealing, the conductive layer for connection and the conductive layers provided over the substrates 11 and 19 are set to be in contact with each other. Therefore, a semiconductor device which is able to transmit and receive an electromagnetic wave can be provided. The embodiment mode of the present invention can be freely combined with other embodiment modes and other embodiments.

Embodiment Mode 4

A method of manufacturing a semiconductor device of the present invention will be described with reference to FIGS. 6A, 6B, 7A, and 7B.

Figure 6A:
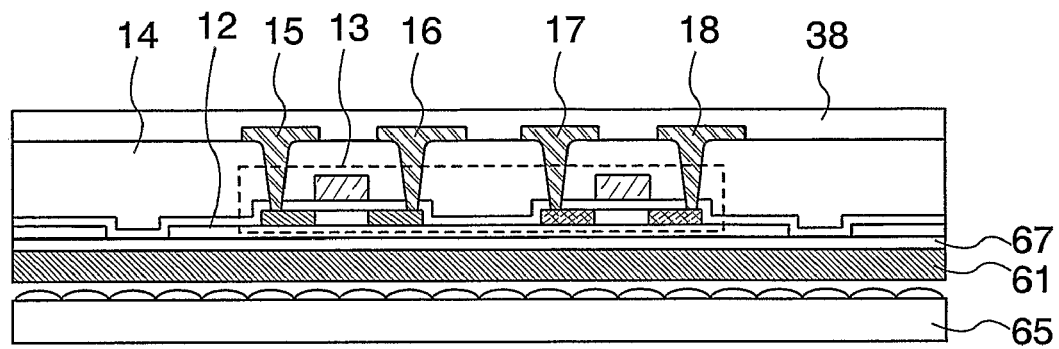
FIGS. 6A and 6B show a semiconductor device according to the present invention.

An insulating layer 67 is formed over one surface of a substrate 61 (see FIG. 6A). Next, an insulating layer 12, a plurality of transistors 13, and an insulating layer 14 are formed over the insulating layer 67. Subsequently, conductive layers 15 to 18 which are connected to source regions or drain regions of the plurality of transistors 13 through openings provided in the insulating layer 14 are formed. Then, an insulating layer 38 is formed so as to cover the insulating layer 14 and the conductive layers 15 to 18. Then, a film or an insulating layer for protection is further provided over the insulating layer 38, if necessary.

The other surface of the substrate 61 is ground by using a grinding device 65. Preferably, a thickness of the substrate 61 is reduced to 100 µm or less by grinding the substrate 61. Generally, in this grinding step, one or both of a stage on which the substrate 61 is fixed and the grinding device 65 is/are turned to grind the other surface of the substrate 61. The grinding device 65, for example, corresponds to a grinding stone. After the grinding step, one or both of a cleaning step for removing dust and a drying step is/are conducted, if necessary.

Figure 6B:
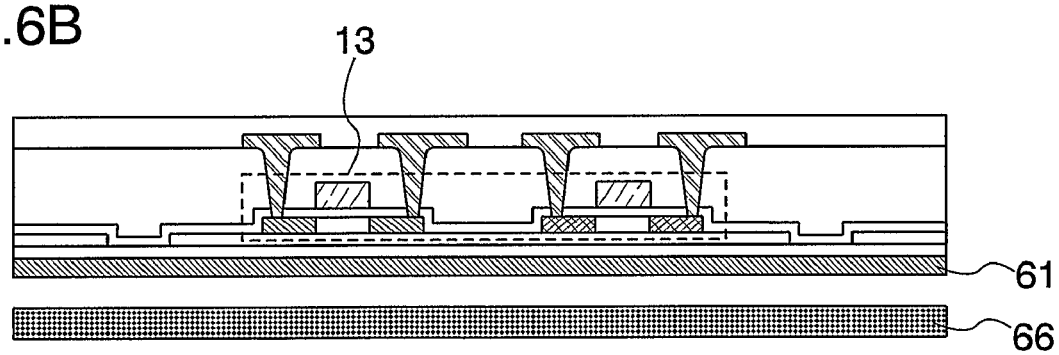

The other surface of the ground substrate 61 is polished by using a polishing device 66 (see FIG. 6B). Preferably, the thickness of the substrate 61 is reduced to 50 µm or less, more preferably 20 µm or less, and much more preferably 5 µm or less by polishing the substrate 61. In this polishing step, as in the grinding step, one or both of a stage in which the substrate 61 is fixed and the polishing device 66 is/are turned to polish the other surface of the substrate 61. The polishing device 66, for example, corresponds to a polishing pad or a polishing abrasive grain (for example cerium oxide or the like). After the polishing step, one or both of a cleaning step for removing dust and a drying step is/are conducted, if necessary.

Figure 7A:
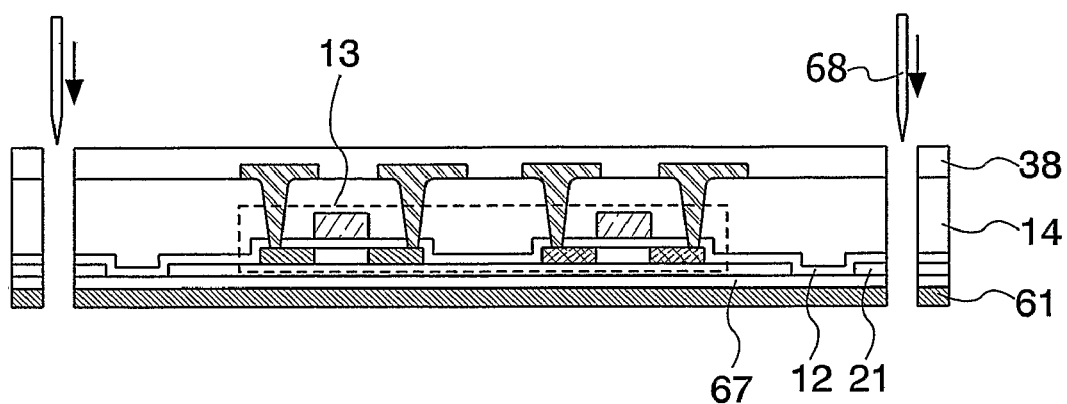
FIGS. 7A and 7B show a semiconductor device according to the present invention.
Figure 7B:
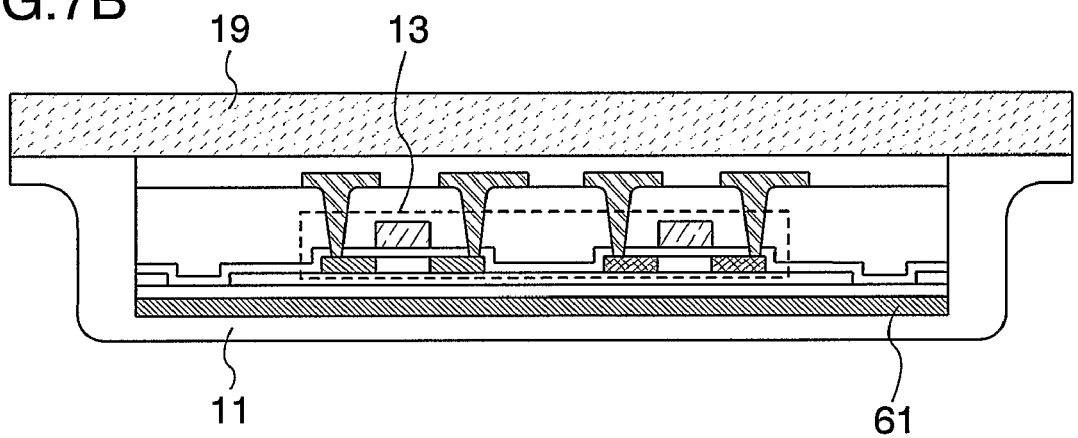
Figure 8A:
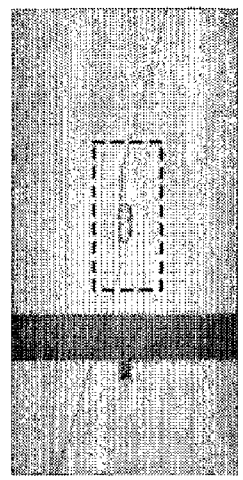
FIGS. 8A to 8F show a semiconductor device according to the present invention.
Figure 8B:
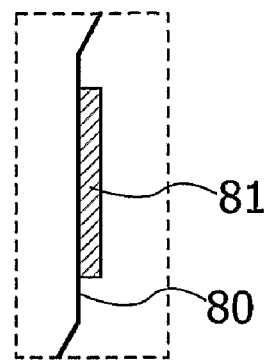
Figure 8C:
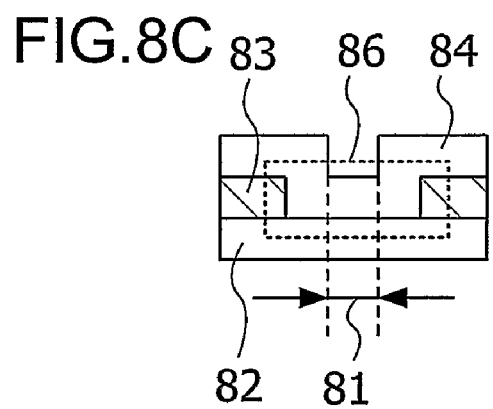
Figure 8D:
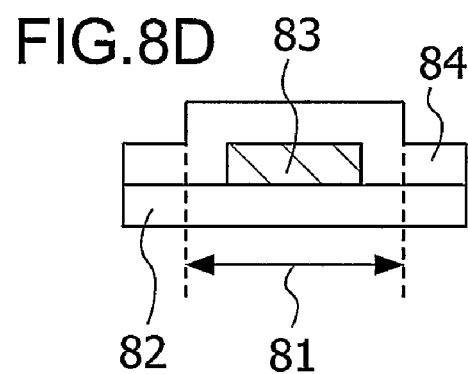
Figure 8E:
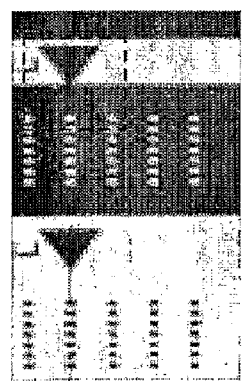
Figure 8F:
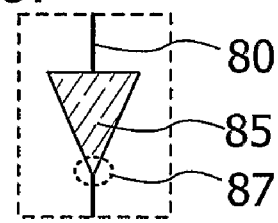

The substrate 61, and the insulating layers 67, 12, 21, 14, and 38 are cut by a cutting device 68 to form a plurality of stacks including the substrates 61 and the plurality of transistors 13 (see FIG. 7A). Next, the stack including the substrate 61 and the plurality of transistors 13 are sealed, if necessary (see FIG. 7B). In this sealing step, specifically, a substrate 11 is provided in the surface of the substrate 61 and a substrate 19 is provided in the surface of the insulating layer 38 and one or both of thermal treatment and pressure treatment is/are performed. The cutting device 68, for example, corresponds to a laser irradiation apparatus or a scribe apparatus.

One feature of a semiconductor device of the present invention is that the semiconductor device has the substrate 61. This feature makes it possible to suppress invasion of harmful gas, water, and an impurity element. Therefore, reliability can be enhanced. Further, the semiconductor device of the present invention has the substrate 61 with a thickness of equal to or less than 100 μm, which is one feature. This feature makes it possible to provide a semiconductor device having flexibility. The embodiment mode of the present invention can be freely combined with other embodiment modes and other embodiments.

Embodiment 1

Figure 9:
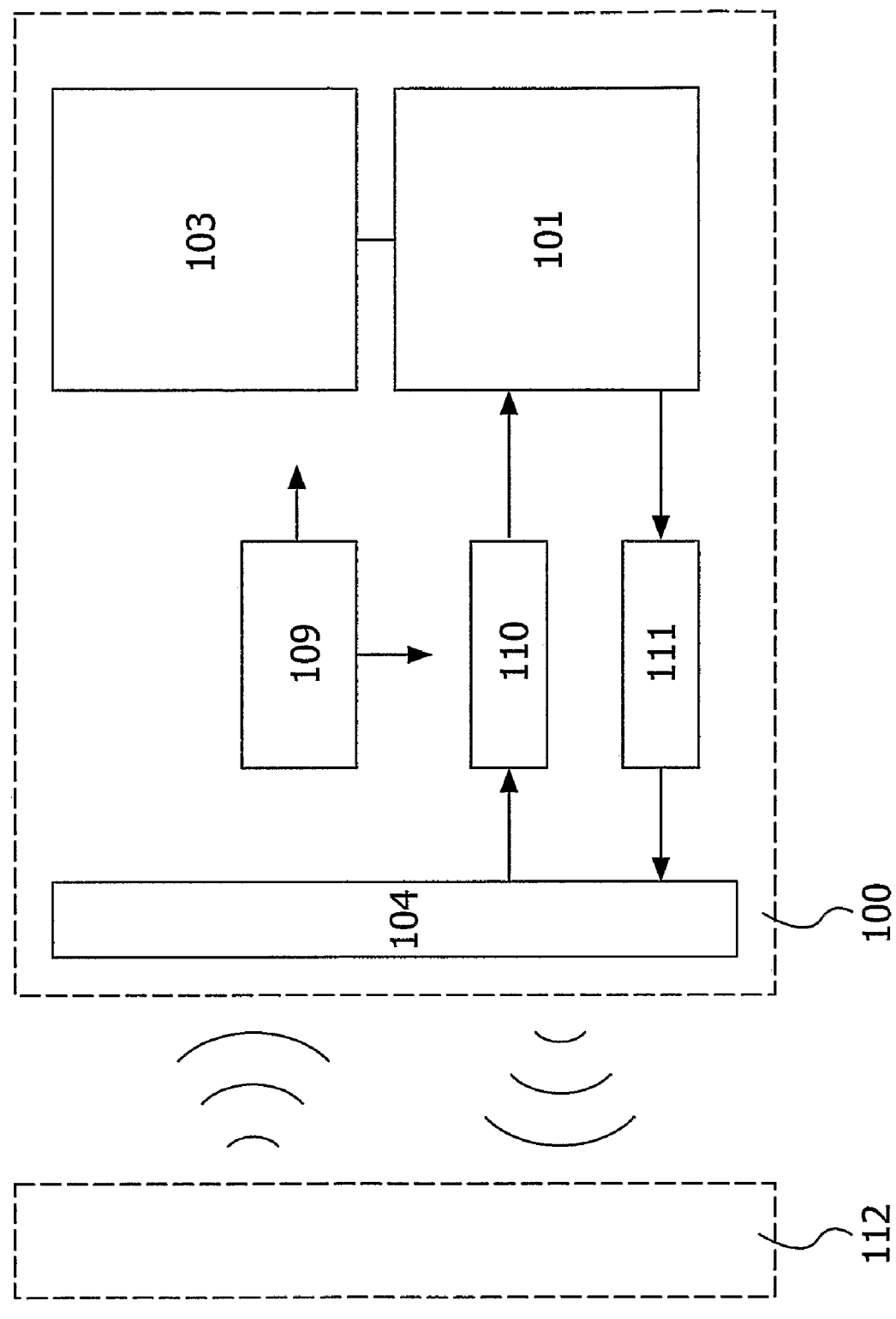
FIG. 9 shows a semiconductor device according to the present invention.

A structure of a semiconductor device of the present invention will be described with reference to FIG. 9. A semiconductor device 100 of the present invention includes an arithmetic processing circuit 101, a memory circuit 103, an antenna 104, a power supply circuit 109, a demodulation circuit 110, and a modulation circuit 111. The semiconductor device 100 necessarily includes the antenna 104 and the power supply circuit 109. Other elements are provided as appropriate in accordance with the usage of the semiconductor device 100.

The arithmetic processing circuit 101 decodes the instruction, controls the memory circuit 103, outputs data to be transmitted to the outside into the modulation circuit 111, or the like, based on a signal input from the arithmetic processing circuit 110.

The memory circuit 103 includes a circuit including a memory element and a control circuit for controlling writing or readout of data. In the memory circuit 103, at least an identification number of the semiconductor device itself is stored. The identification number is used for distinguishing the semiconductor device from other semiconductor devices. In addition, the memory circuit 103 includes one or plural memories selected from an organic memory, a DRAM (Dynamic Random Access Memory), a SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory) and a flash memory. An organic memory has a structure in which a layer containing an organic compound is interposed between a pair of conductive layers. Since an organic memory has a simple structure, the manufacturing process can be simplified and the cost can be reduced. In addition, due to the simple structure, an area of a stack can be easily reduced, and high integration can be easily realized. Further, it is also an advantage that an organic memory is nonvolatile and does not require incorporation of a battery. Accordingly, it is preferable to use the organic memory as the memory circuit 103.

The antenna 104 converts a carrier wave provided from a reader/writer 112 into an alternating electrical signal. In addition, load modulation is applied from the modulation circuit 111. The power supply circuit 109 generates power voltage by using the alternating electrical signal converted by the antenna 104 and supplies power voltage to each circuit.

The demodulation circuit 110 demodulates the alternating electrical signal converted by the antenna 104 and supplies the demodulated signal into the arithmetic processing circuit 101. The modulation circuit 111 applies load modulation to the antenna 104, based on the signal supplied from the arithmetic processing circuit 101.

The reader/writer 112 receives the load modulation applied to the antenna 104 as a carrier wave. In addition, the reader/writer 112 transmits the carrier wave to the semiconductor device 100. Note that the carrier wave refers to an electromagnetic wave which is generated in the reader/writer 112.

A semiconductor device of the invention having a function of wirelessly transmitting and receiving an electromagnetic wave as described above is called an RFID (Radio Frequency Identification), an RF chip, an RF tag, an IC chip, an IC tag, an IC label, a wireless chip, a wireless tag, an electronic chip, an electronic tag, a wireless processor, or a wireless memory. The present embodiment can be freely combined with other embodiment modes.

Embodiment 2

Figure 10A:
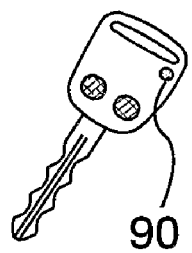
FIGS. 10A to 10E show a semiconductor device according to the present invention.
Figure 10B:
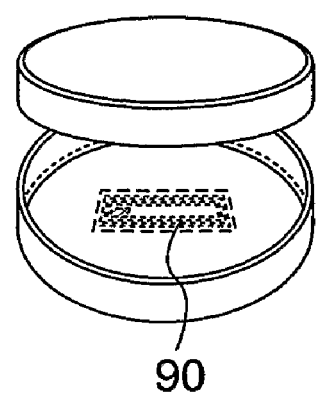
Figure 10C:
Figure 10D:

A semiconductor device 90 of the present invention can be applied to various articles and systems by utilizing its function of transmitting and receiving an electromagnetic wave. The articles, for example, are keys (see FIG. 10A), paper money, coins, securities, bearer bonds, certificates (a driver's license, a resident card, or the like), books, cases (a petri dish or the like, see FIG. 10B), belongings (bags glasses, or the like, see FIG. 10C), packing cases (wrapping paper, bottles, or the like, see FIG. 10D), recording media (a disc or a video tape, or the like), vehicles (a bicycle or the like), foods, clothing, commodities, electronics (such as a liquid crystal display device, an EL display device, a television device, a cellular phone, or the like), or the like. Semiconductor devices of the present invention are fixed by being attached to surfaces of the articles having various shapes such as the above, or being embedded into the article.

Figure 10E:
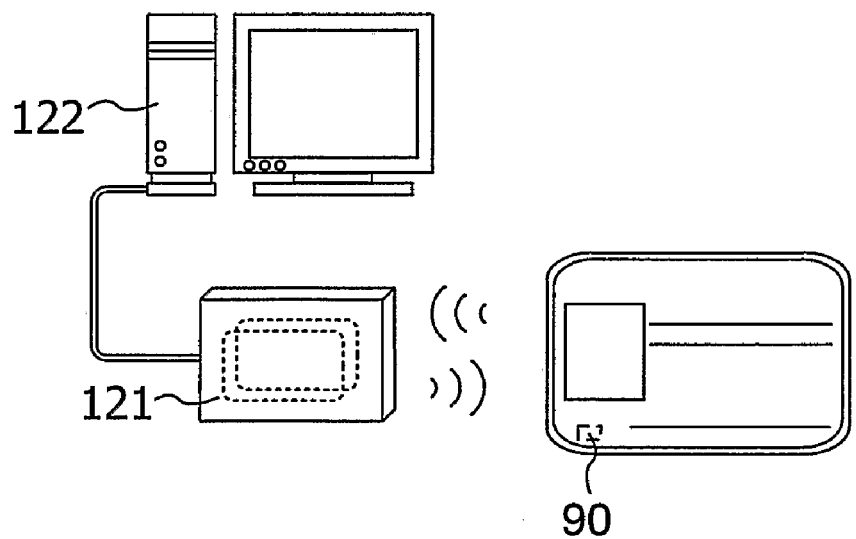

In addition, the systems refer to a physical-distribution inventory system, an authentication system, a distribution system, a production history system, a book management system, and the like. By using a semiconductor device of the present invention, sophistication, multifunction, and high added value of the system can be obtained. For example, a semiconductor device of the present invention is provided inside an identification card and a reader/writer 121 is provided at an entrance of a building or the like (see FIG. 10E). The reader/writer 121 reads an authentication number contained in the identification card owned by each person, and supplies information about the read authentication number to a computer 122. The computer 122 determines whether to authorize the person's entrance or exit, based on the information supplied from the reader/writer 121. In this way, by using a semiconductor device of the present invention, security is ensured and an entrance-exit management system in which sophistication and high added value is achieved can be provided. The present embodiment can be freely combined with other embodiment modes and other embodiments.

Embodiment 3

In the present embodiment, a method of manufacturing a transistor will be described with reference to FIGS. 11A to 11D, 12A to 12C, 13A, and 13B.

Figure 11A:
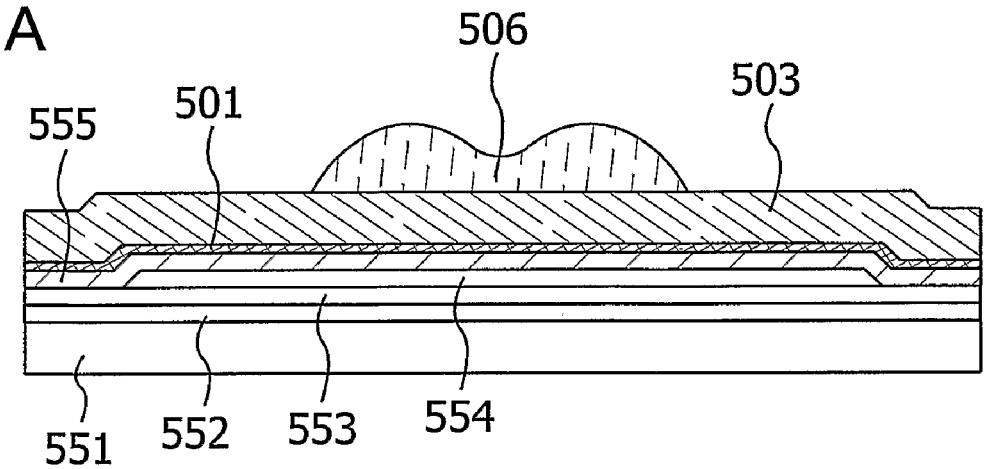
FIGS. 11A to 11D show a method of manufacturing a transistor.

An insulating layer 552 is formed over a substrate 551 (see FIG. 11A). Next, an insulating layer 553 is formed over the insulating layer 552. Subsequently, a semiconductor layer 554 is formed over the insulating layer 553. Then, a gate insulating layer 555 is formed over the semiconductor layer 554.

The semiconductor layer 554 is formed through the manufacturing process described below, for example. First, an amorphous semiconductor layer is formed by sputtering, LPCVD, plasma CVD, or the like. Subsequently, the amorphous semiconductor layer is crystallized by a laser crystallization method, an RTA (Rapid Thermal Anneal) method, a thermal crystallization method using an annealing furnace, a thermal crystallization method using a metal element promoting crystallization, a method in which the thermal crystallization method using a metal element promoting crystallization and the laser crystallization method are combined, or the like to form a crystalline semiconductor layer. Then, the crystalline semiconductor layer obtained is patterned to form a desired shape.

The semiconductor layer 554 is preferably formed by a combination of a crystallization method including thermal treatment and a crystallization method in which irradiation of a continuous wave laser or a laser beam oscillating with a frequency of 10 MHz or more is conducted. By being irradiated with a continuous wave laser or a laser beam oscillating with a frequency of 10 MHz or more, a surface of the crystallized semiconductor layer 554 can be planarized. In addition, by planarizing the surface of the semiconductor layer 554, the gate insulating layer 555 can be thinned. Further, the pressure-resistance of the gate insulating layer 555 can be increased.

Further, the gate insulating layer 555 may be formed by oxidizing or nitriding the surface of the semiconductor layer 554 by performing plasma treatment. For example, plasma treatment is employed, in which a mixed gas of a rare gas such as He, Ar, Kr, or Xe and oxygen, nitrogen oxide, ammonia, nitrogen, hydrogen, or the like is introduced. Plasma excitation in this case is preferably performed by introducing a microwave. When plasma excitation is performed by introducing the microwave, plasma with a low electron temperature and a high density can be generated. In addition, the gate insulating layer 555 can be formed by oxidizing or nitriding the surface of the semiconductor layer 554 by use of oxygen radicals (which may include OH radicals) or nitrogen radicals (which may include NH radicals) generated by the high density plasma. In other words, an insulating layer having a thickness of 1 to 20 nm, typically 5 to 10 nm, is formed over the surface of the semiconductor layer 554 by such high density plasma treatment. Since a reaction in this case is a solid-phase reaction, an interface state density between the insulating layer and the semiconductor layer 554 can be extremely lowered.

In such high density plasma treatment, since a semiconductor layer (crystalline silicon or polycrystalline silicon) is directly oxidized (or nitrided), variation in the thickness of the gate insulating layer to be formed over the surface of the semiconductor layer can be extremely reduced. In addition, a semiconductor layer in a crystal grain boundary of crystalline silicon is not oxidized too much. In other words, in the high density plasma treatment described herein, by solid-phase oxidizing the surface of the semiconductor layer 554, a gate insulating layer 555 which has good uniformity and low interface state density can be formed, without excessive oxidation in a crystal grain boundary.

As for the gate insulating layer 555, just the insulating layer formed by high density plasma treatment may be used, or an insulating layer of silicon oxide, silicon oxynitride, silicon nitride, or the like may be stacked over the insulating layer by a CVD method using plasma or thermal reaction. In either case, characteristic variation can be reduced in a transistor including an insulating film formed by using high density plasma as the gate insulating layer 555 or as a part of the gate insulating layer 555.

Further, the semiconductor layer 554 which is crystallized by being scanned into one direction with a continuous wave laser beam or a laser beam oscillating with a frequency of 10 MHz or more, has a characteristic in which crystals are grown into a scanning direction of the beam. A transistor in which characteristic variation is reduced and field effect mobility is high can be obtained by setting the transistor so as to make the scanning direction the same as a channel length direction (a direction in which carriers are flown when a channel forming region is formed) and employing the above-described method to form a gate insulating layer.

The insulating layers 552 and 553, the semiconductor layer 554, the gate insulating layer 555, or the like may be formed by using plasma treatment. Such plasma treatment is preferably performed with an electron density of $1\times10^{11}$ cm$^{-3}$ or more and an electron temperature of plasma of 1.5 eV or less. More specifically, it is preferably performed with an electron density from $1\times10^{11}$ cm$^{-3}$ to $1\times10^{13}$ cm$^{-3}$ and an electron temperature of plasma from 0.5 eV to 1.5 eV.

When plasma has a high electron density and a low electron temperature in the vicinity of an object to be processed (for example, the insulating layers 552 and 553, the semiconductor layer 554, the gate insulating layer 555, or the like), the object to be processed can be prevented from being damaged from the plasma. In addition, since an electron density of plasma is as high as or more than $1\times10^{11}$ cm$^{-3}$, oxide or nitride formed by oxidizing or nitriding an object to be irradiated using plasma treatment is superior in uniformity of film thickness or the like and can be a denser film, compared with a thin film formed by CVD, sputtering, or the like. In addition, since the electron temperature of the plasma is as low as or less than 1.5 eV, oxidizing treatment or nitriding treatment can be conducted with a lower temperature, compared with conventional plasma treatment or a thermal oxidation method. For example, even when plasma treatment is performed at a temperature 100° C. or more lower than a strain point of a glass substrate, oxidizing treatment or nitriding treatment can be performed sufficiently.

Next, conductive layers 501 and 503 are stacked over the gate insulating layer 555. Each of the conductive layers 501 and 503 is formed with a metal such as tungsten, chromium, tantalum, tantalum nitride or molybdenum, or an alloy or a compound containing the metal as its main component. Note that the conductive layers 501 and 503 are formed by using different materials from each other. Specifically, the conductive layers 501 and 503 are formed with different materials which cause a difference in an etching rate in an etching step to be performed later.

Next, a mask 506 made of a resist is formed over the conductive layer 503. The mask 506 is formed by using an exposure mask including a light shielding film and a translucent film. A specific structure of this mask will be described later.

Figure 11B:
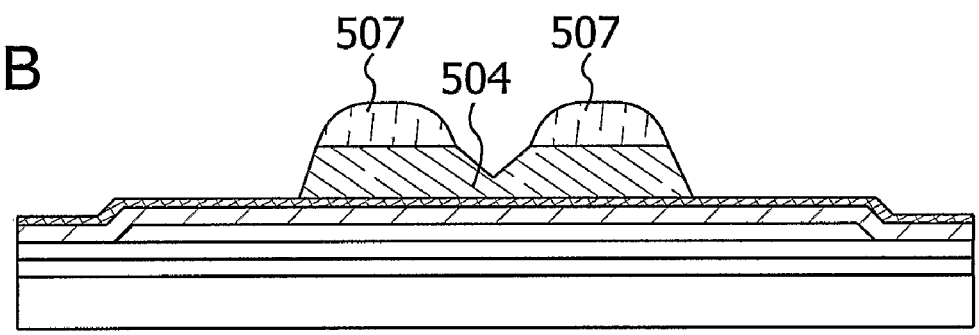
Figure 11C:
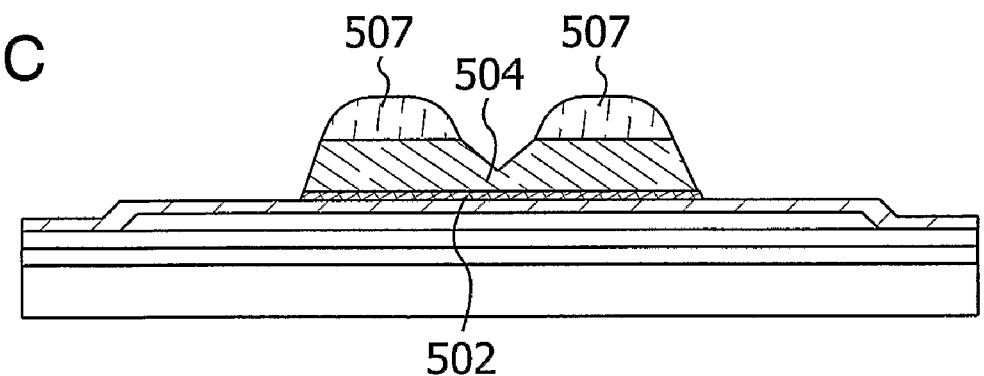

Subsequently, the conductive layer 503 is etched by using the mask 506 to form masks 507 and a conductive layer 504 (see FIG. 11B). The mask 506 is sputtered by ions accelerated by an electric field. Then, the mask is divided into the two masks 507 and the two masks 507 are separately disposed. Then, the conductive layer 501 is etched by using the masks 507 and the conductive layer 504 to form a conductive layer 502 (see FIG. 11C).

Figure 11D:
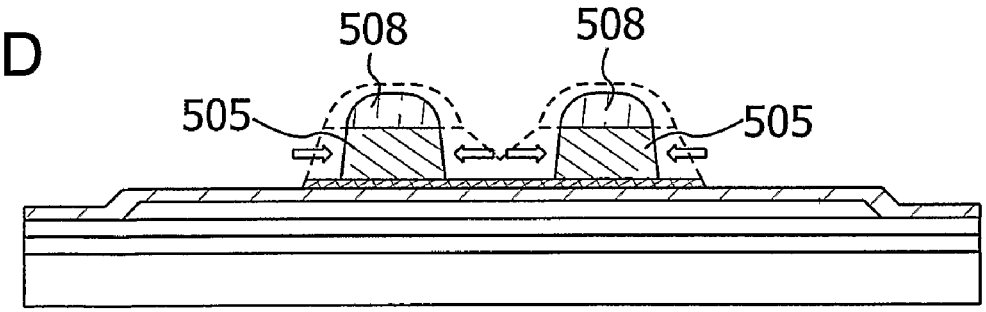

Subsequently, the masks 507 and the conductive layer 504 are selectively etched to form masks 508 and conductive layers 505 (see FIG. 11D). The masks 508 are sputtered by ions accelerated by the electric field to be reduced in size. In this step, attention needs to be paid so as not to etch the conductive layer 502, by adjusting a bias voltage which is applied into a substrate side.

Figure 12A:
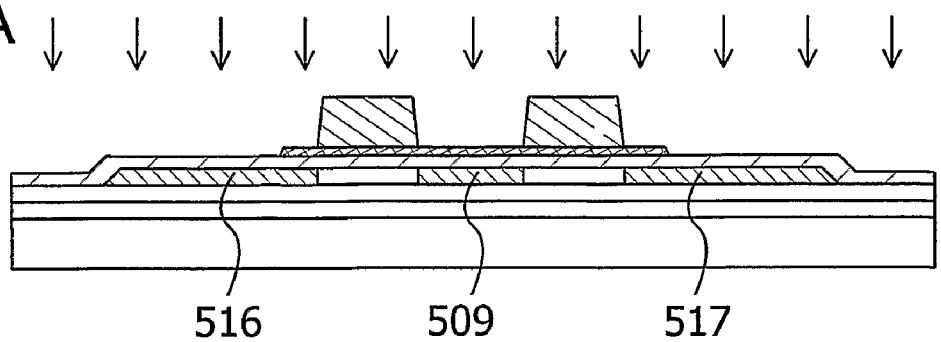
FIGS. 12A to 12C show a method of manufacturing a transistor.

Then, the semiconductor layer 554 is doped with an impurity element imparting one conductivity type to form impurity regions 509, 516, and 517 having a first concentration (see FIG. 12A). At this time, the semiconductor layer 554 is doped with an impurity element in a self-aligning manner by using the conductive layers 502 and 505.

Figure 12B:
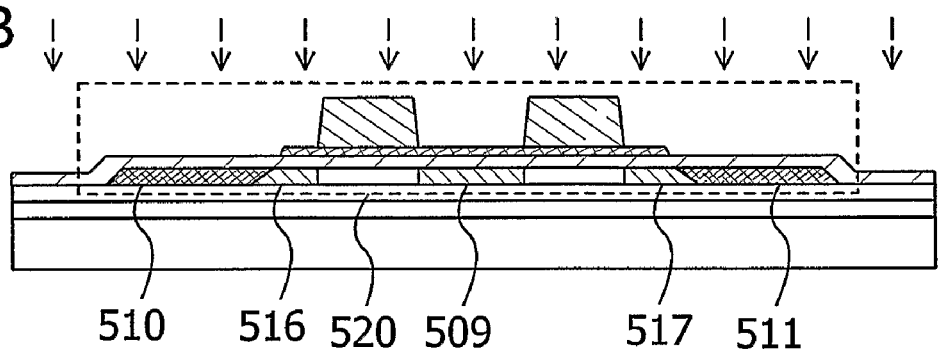

Next, the semiconductor layer 554 is doped with an impurity element imparting one conductivity type to form impurity regions 510 and 511 having a second concentration (see FIG. 12B). Note that a portion of the semiconductor layer 554 which overlaps the conductive layer 505 is not doped with an impurity element imparting one conductivity. Accordingly, the portion of the semiconductor layer 554 which overlaps the conductive layer 505 functions as a channel forming region. Through the above described process, a thin film transistor 520 is completed.

Figure 12C:
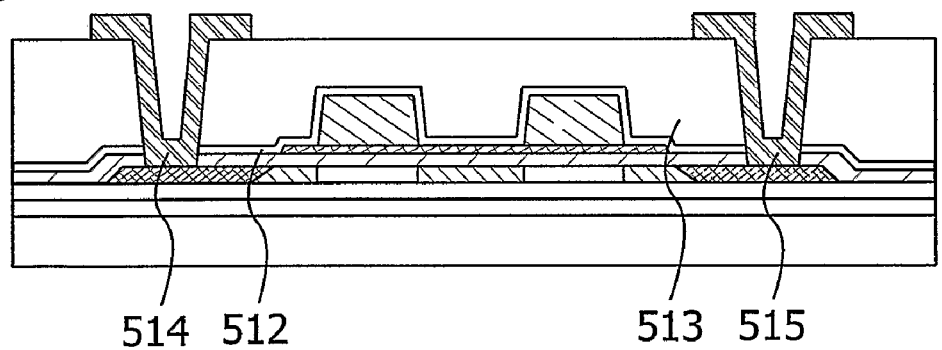

Next, insulating layers 512 and 513 are formed to cover the thin film transistor 520 (see FIG. 12C). Subsequently, conductive layers 514 and 515 connected to the impurity regions 510 and 511 having a second concentration are formed through openings provided in the insulating layers 512 and 513.

One feature of the above described process is to etch the conductive layers 501 and 503 by using the mask 506 having a complicated shape in which the thickness varies. By using the mask 506, the masks 507 can be formed separately from each other. Then, the distance between two channel forming regions can be reduced. Specifically, the distance between the two channel forming regions can be less than 2 µm. Accordingly, in the case of forming a multigate thin film transistor including two or more gate electrodes, the space for the transistor can be reduced. Therefore, a sophisticated semiconductor device in which high integration is achieved can be provided.

Figure 13A:
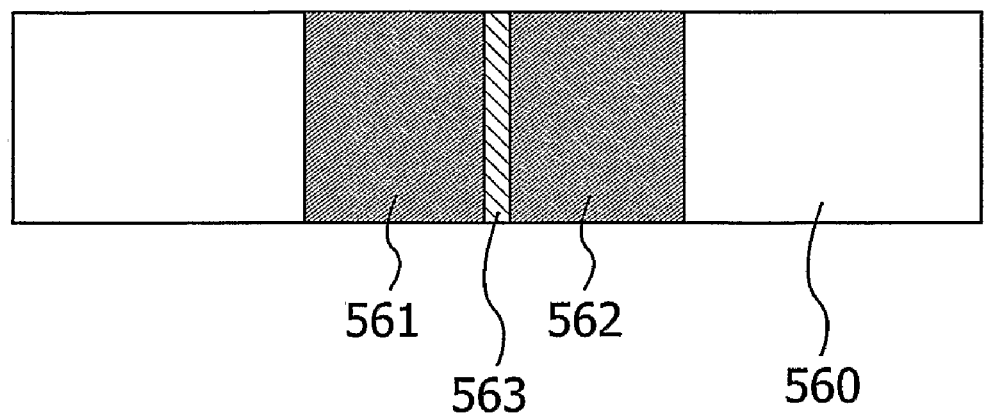
FIGS. 13A and 13B show a method of manufacturing a transistor.
Figure 13B:
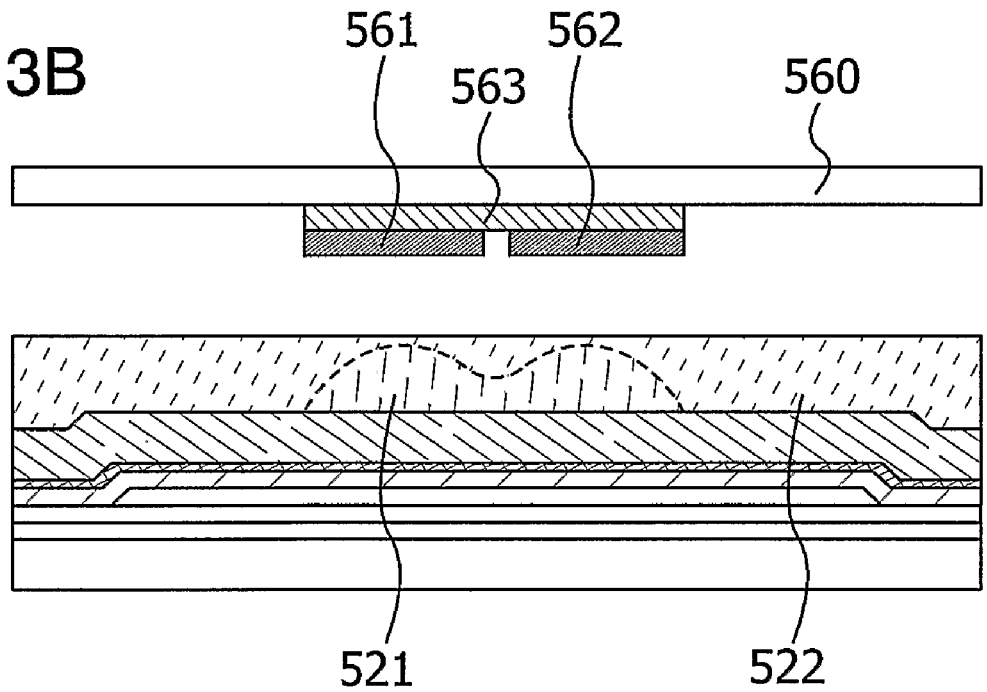

Next, a method of forming the mask 506 is described with reference to FIGS. 13A and 13B. FIG. 13A is an enlarged top view of a part of an exposure mask. FIG. 13B is a cross-sectional view of the part of the exposure mask corresponding to FIG. 13A and a cross-sectional view of the stack including the substrate 551.

The exposure mask includes a light-transmitting substrate 560, light shielding films 561 and 562, and a translucent film 563. The light shielding films 561 and 562 each include a metal film of chromium, tantalum, $CrN_x$ (x is a positive integer), or the like. The material of the translucent film 563 is appropriately selected correspondingly to the exposure wavelength. For example, $TaSi_xO_y$ (x and y are positive integers), $CrO_xN_y$ (x and y are positive integers), $CrF_xO_y$ (x and y are positive integers), $MoSi_xN_y$ (x and y are positive integers), or $MoSi_xO_y$ (x and y are positive integers) may be used. The translucent film 563 functions as an auxiliary pattern.

The exposure of a resist mask with the use of the exposure mask having the above described structure broadly divides the resist mask into a region 521 which is not exposed to light and a region 522 which is exposed to light. When development process is conducted in this state, the resist in the region 522 which is exposed to light is removed, and the mask 506 having the shape as shown in FIG. 14A is formed. This embodiment can be freely combined with other embodiment modes and other embodiments.

This application is based on Japanese Patent Application serial no. 2005-159633 filed in Japan Patent Office on May 31, 2005, the entire contents of which are hereby incorporated by reference.

The invention claimed is:

1. A semiconductor device comprising:
a first substrate;
a first insulating layer over the first substrate;
a semiconductor layer over the first insulating layer;
a second insulating layer over the semiconductor layer and the first insulating layer;
a first conductive layer over the second insulating layer;
a third insulating layer over the first conductive layer and the second insulating layer;
a second conductive layer connected to a source region or a drain region of the semiconductor layer through an opening provided in the third insulating layer;
a fourth insulating layer over the third insulating layer; and
a second substrate over the fourth insulating layer,
wherein a transistor comprises a semiconductor layer, the first conductive layer, and the second insulating layer provided between the semiconductor layer and the first conductive layer,
wherein a layer is provided over the first substrate, and is provided not to overlap the transistor, and
wherein one or two layers selected from the first insulating layer and the second insulating layer have a step portion which is formed by a corner of the layer.

2. The semiconductor device according to claim 1, wherein the step portion makes a crack progress to a region which does not overlap with the transistor.

3. The semiconductor device according to claim 1, wherein a protective layer is provided between the first substrate and the first insulating layer.

4. The semiconductor device according to claim 1, wherein a protective layer is provided between the second substrate and the fourth insulating layer.

5. The semiconductor device according to claim 1, wherein the first substrate has a thickness of equal to or less than 100 µm.

6. A semiconductor device comprising:
a first substrate;
a first insulating layer over a first substrate;
a semiconductor layer over the first insulating layer;
a second insulating layer over the semiconductor layer and the first insulating layer;
a first conductive layer over the second insulating layer;
a third insulating layer over the first conductive layer and the second insulating layer;
a second conductive layer connected to a source region or a drain region of the semiconductor layer through an opening provided in the third insulating layer; and
a second substrate over the fourth insulating layer,
wherein a transistor comprises a semiconductor layer, the first conductive layer, and the second insulating layer provided between the semiconductor layer and the first conductive layer,
wherein a groove is provided over the first substrate, and is provided not to overlap the transistor,
wherein one or two layers selected from the first insulating layer and the second insulating layer have a step portion which is formed by a corner of the groove.

7. The semiconductor device according to claim 6, wherein the step portion makes a crack progress to a region which does not overlap with the transistor.

8. The semiconductor device according to claim 6, wherein a protective layer is provided between the first substrate and the first insulating layer.

9. The semiconductor device according to claim 6, wherein a protective layer is provided between the second substrate and the fourth insulating layer.

10. The semiconductor device according to claim 6, wherein the first substrate has a thickness of equal to or less than 100 µm.

11. A semiconductor device comprising:
a first substrate;
a first insulating layer over the first substrate;
a semiconductor layer over the first insulating layer;
a second insulating layer over the semiconductor layer and the first insulating layer;
a first conductive layer over the second insulating layer;
a third insulating layer over the first conductive layer and the second insulating layer;
a second conductive layer connected to a source region or a drain region of the semiconductor layer through an opening provided in the third insulating layer;
a fourth insulating layer over the third insulating layer; and
a second substrate over the fourth insulating layer,
wherein a transistor comprises the semiconductor layer, the first conductive layer, and the second insulating layer provided between the semiconductor layer and the first conductive layer,
wherein a layer is provided over the first substrate, and is provided not to overlap the transistor,
wherein one or two layers selected from the first insulating layer and the second insulating layer have a step portion which is formed by a corner of the layer; and
wherein the layer is a polygonal layer having an interior angle of equal to or less than 90 degrees.

12. The semiconductor device according to claim 11, wherein a protective layer is provided between the first substrate and the first insulating layer.

13. The semiconductor device according to claim 11, wherein a protective layer is provided between the second substrate and the fourth insulating layer.

14. The semiconductor device according to claim 11, wherein the first substrate has a thickness of equal to or less than 100 µm.

15. A semiconductor device comprising:
a first substrate;
a first insulating layer over the first substrate;
a semiconductor layer over the first insulating layer;
a second insulating layer over the semiconductor layer and the first insulating layer;
a first conductive layer over the second insulating layer;
a third insulating layer over the first conductive layer and the second insulating layer;
a second conductive layer connected to a source region or a drain region of the semiconductor layer through an opening provided in the third insulating layer;
a fourth insulating layer over the third insulating layer and
a second substrate over the fourth insulating layer,
wherein a transistor comprises the semiconductor layer, the first conductive layer, and the second insulating layer provided between the semiconductor layer and the first conductive layer,
wherein a groove is provided over the first substrate, and is provided not to overlap the transistor,
wherein one or two layers selected from the first insulating layer and the second insulating layer have a step portion which is formed by a corner of the groove, and
wherein a shape of the groove is a polygonal shape having an interior angle of equal to or less than 90 degrees.

16. The semiconductor device according to claim 15, wherein a protective layer is provided between the first substrate and the first insulating layer.

17. The semiconductor device according to claim 15, wherein a protective layer is provided between the second substrate and the fourth insulating layer.

18. The semiconductor device according to claim 15, wherein the first substrate has a thickness of equal to or less than 100 µm.

* * * * *